United States Patent [19]

Nakamura et al.

[11] 4,387,294

[45] Jun. 7, 1983

[54] SHIFT REGISTER-LATCH CIRCUIT DRIVEN BY CLOCKS WITH HALF CYCLE PHASE DEVIATION AND USABLE WITH A SERIAL ALU

[75] Inventors: Hideo Nakamura, Hinode; Tsuneo Funabashi, Hachiouji, both of Japan

[73] Assignee: Hitachi, Ltd., Tokyo, Japan

[21] Appl. No.: 147,078

[22] Filed: May 7, 1980

[30] Foreign Application Priority Data

May 14, 1979 [JP] Japan ................... 54/58140

[51] Int. Cl.³ .......................... G06F 7/48
[52] U.S. Cl. ................... 377/78; 364/900; 364/712; 377/43; 377/49
[58] Field of Search ........ 235/92 SH, 92 DP, 92 CC, 235/92 EV; 307/221 R; 328/37; 364/200 MS File, 900 MS File, 712, 716

[56] References Cited

U.S. PATENT DOCUMENTS

| | | | |
|---|---|---|---|
| 3,940,596 | 2/1976 | Paddock | 235/92 LG |
| 3,993,916 | 11/1976 | Copeland et al. | 307/221 C |
| 4,075,464 | 2/1978 | Davies, Jr. | 235/92 EN |
| 4,224,531 | 9/1980 | Ebihara et al. | 307/221 C |
| 4,224,676 | 9/1980 | Appelt | 364/712 |
| 4,242,735 | 12/1980 | Sexton | 364/900 |
| 4,244,028 | 1/1981 | Haines | 364/712 |
| 4,255,785 | 3/1981 | Chamberlain | 364/200 |
| 4,256,954 | 3/1981 | Someshwar | 235/92 SH |
| 4,277,675 | 7/1981 | Mar et al. | 235/92 MB |
| 4,293,919 | 10/1981 | Dasgupta et al. | 364/716 |
| 4,348,722 | 9/1982 | Gunter et al. | 364/200 |
| 4,348,741 | 9/1982 | McAlister et al. | 364/900 |

*Primary Examiner*—James D. Thomas
*Assistant Examiner*—Archie E. Williams
*Attorney, Agent, or Firm*—Antonelli, Terry & Wands

[57] ABSTRACT

In a multiple stage data transfer circuit, suitable for transferring a plurality of bits to or from a bit processor or 1-bit arithmetic logic unit, each bit stage includes a shift register portion and a latch portion. Each shift register(S/R) portion is constructed of a series circuit consisting of a static (input) inverter, a switching element, and a dynamic (output) inverter. Each latch portion is constructed of a closed loop consisting of a static inverter, a switching element, and a dynamic inverter. Each bit stage also includes a data transfer switch element, which may be activated through an externally connected control line. The data transfer switch is coupled beween the data output terminal of the S/R switch and the data output terminal of the latch switch. The S/R and latch portion switches are activated by two different clocks, with a phase deviation therebetween of one-half cycle. When the S/R switch and data transfer switch are both "ON", data may flow from the S/R's input inverter to the latch. When the latch switch and the data transfer switch are both "ON", data may flow from the latch to the S/R's output inverter.

9 Claims, 7 Drawing Figures

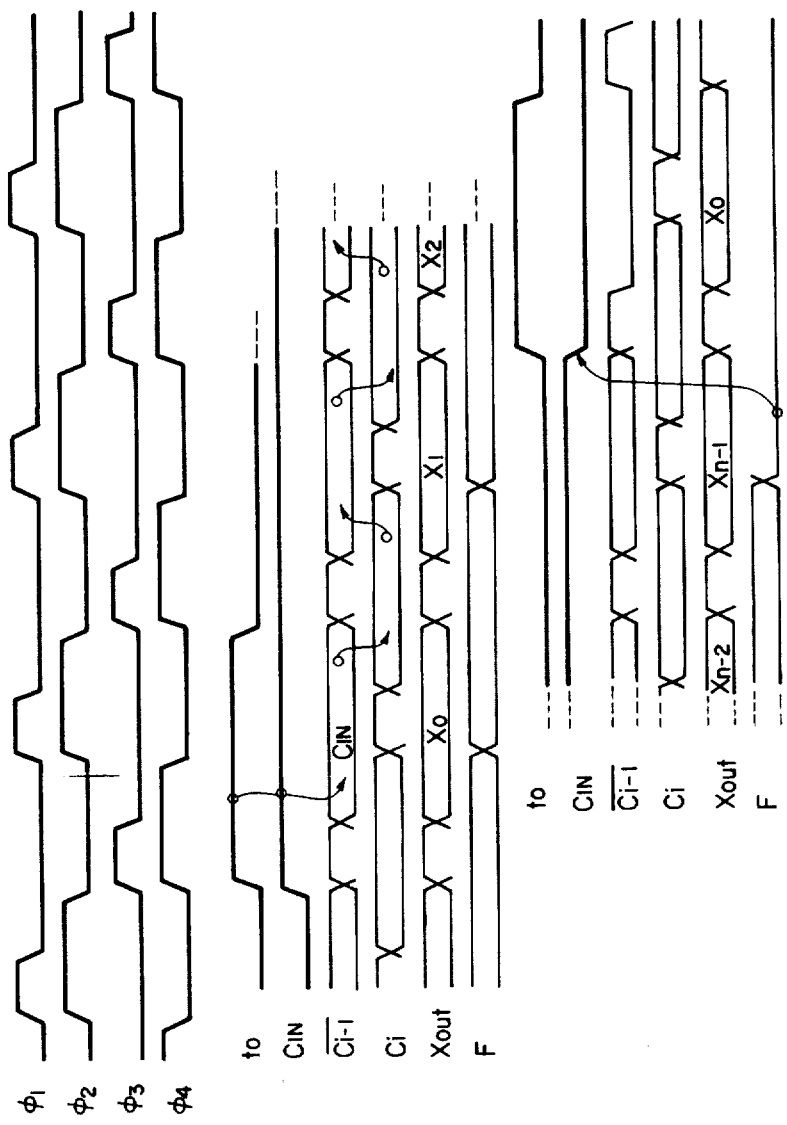

SHIFT REGISTER-LATCH CIRCUIT DRIVEN BY CLOCKS WITH HALF CYCLE PHASE DEVIATION AND USABLE WITH A SERIAL ALU

BACKGROUND OF THE INVENTION (1) Field of the Invention

This invention relates to a shift register, and more particularly to a shift register with a latch circuit suitable for a serial arithmetic logic unit.

(2) Description of the Prior Art

A serial arithmetic logic unit (serial ALU) consists of a shift register which has a required number of bits, and a 1-bit ALU which is connected to the least significant bit of the shift register and which executes an operation corresponding to one bit in one cycle and feeds the result back to the most significant bit of the shift register. By way of example, it is applied as a peripheral equipment in order to determine the "on" and "off" timings of control signals, etc. in various control systems employing data processors.

The serial ALU for such uses requires a shift register with a latch circuit in order to set desired value data into the shift register and to read out operated result data from the shift register. In the case where the serial ALU and circuits associated therewith are put into the form of a LSI so as to fabricate a device which is multipurpose for various control systems, the shift register with the latch circuit needs to be made as a circuit arrangement exhibiting a low power dissipation and suited to the form of a LSI.

SUMMARY OF THE INVENTION

It is accordingly the principal object of this invention to provide a shift register with a latch circuit exhibiting a low power dissipation and having a structure suitable for the form of a LSI.

In order to accomplish the object, according to this invention, each of the bit stages of a shift register as are connected in cascade to one another is constructed of a series circuit which consists of a static inverter, a switching element and a dynamic inverter; a latch circuit which is constructed of a closed loop consisting of a static inverter, a switching element and a dynamic inverter is disposed every bit stage of the shift register; and the output side terminals of the switching element of the shift register and the switching element of the latch circuit are connected by a switching element for transferring data. The shift register and the latch circuit are driven at timings deviating a half cycle from each other, whereby when the switching element on the side receiving the data is in the "off" state, the data transfer between the shift register and the latch circuit is executed through the switching element for the data transfer.

The foregoing and other objects, advantages, manner of operation and novel features of the present invention will be understood from the following detailed description when read in connection with the accompanying drawings.

BRIEF DESCRIPTION OF THE DRAWINGS

FIG. 6 is a signal time chart showing the operation of the 1-bit arithmetic logic unit.

DESCRIPTION OF THE PREFERRED EMBODIMENTS

Figure 1:
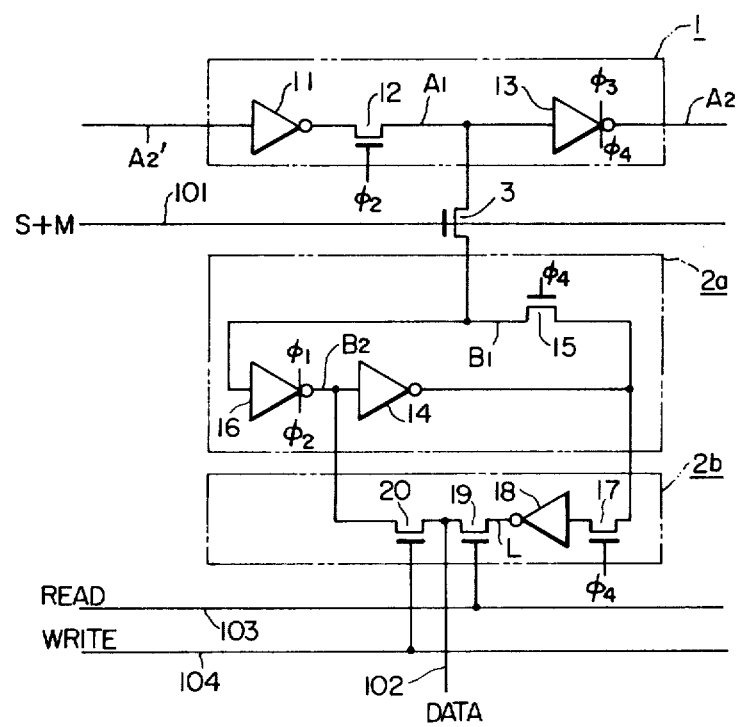
FIG. 1 is a circuit diagram showing the essential portions of a shift register with a latch circuit according to this invention.

In FIG. 1 which shows the circuit arrangement of the 1-bit constituent of a shift register with a latch circuit according to this invention, numeral 1 designates a shift register portion, symbol 2a a latch portion, symbol 2b a data input/output portion, and numeral 3 a MOS switch for transferring data.

The shift register portion 1 has its first half part constructed of a static inverter 11 and a MOS switch 12 and has its latter half part constructed of a dynamic inverter 13. It receives a signal $A_2'$ supplied from the more significant bit stage, by means of the inverter 11 and delivers an output signal $A_2$ of the inverter 13 to a shift register portion on the less significant bit side.

Likewise to the shift register portion, the latch portion 2a has its first half part constructed of a static inverter 14 and a MOS switch 15 and has its latter half part constructed of a dynamic inverter 16. These elements form a closed loop so that an output signal $B_2$ of the inverter 16 may be fed back to the inverter 14.

The data input/output portion 2b is constructed of a series circuit which consists of a MOS switch 17, a static inverter 18 and MOS switches 19 and 20. This series circuit is connected in parallel with the inverter 14 of the latch portion 2a, and has a circuit arrangement wherein the gates of the MOS switches 19 and 20 are respectively connected to a READ control line 103 and a WRITE control line 104, the juncture of both these switches being connected to a DATA line 102.

The data transferring switch 3 is inserted between the output side of the switch 12 of the shift register portion and the output side of the switch 15 of the latch portion, and has its conduction controlled by a set signal S or a move signal M appearing on a signal line 101.

Now, the operation of the above circuit will be described with reference to a signal time chart shown in FIG. 2.

In the latching shift register of this invention, the shift register portion and the latch portion are caused to execute signal shift operations at timings which deviate a half cycle therebetween. To this end, in case of employing as the dynamic inverter a 2-phase clock drive type inverter which is composed of three MOS transistors 21, 22 and 23 as shown by way of example in FIG. 3, clocks $\phi_1$–$\phi_4$ in four phases as illustrated in FIG. 2 are produced, and the inverter 16 on the latch side is driven by the clocks $\phi_1$ and $\phi_2$ while the inverter 13 on the shift register side is driven by the clocks $\phi_3$ and $\phi_4$. The switch 15 on the latch side has its conduction controlled by the clock $\phi_4$, and the switch 12 on the shift register side by the clock $\phi_2$.

Figure 3:
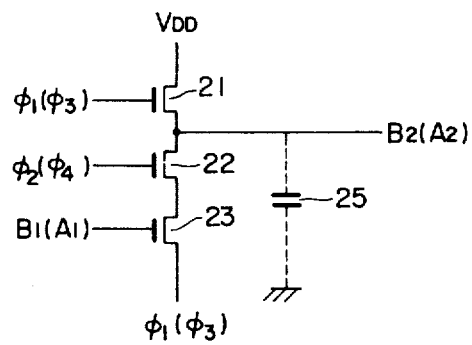
FIG. 3 is a circuit diagram of an embodiment of a dynamic inverter which is applied to the circuit of this invention.

The dynamic inverter in FIG. 3 precharges a stray capacitance 25 on the output side in the period of the clock $\phi_1$ ($\phi_3$), and provides the inverted signal $B_2$ ($A_2$) of an input signal $B_1$ ($A_1$) in the latter half of the period of the clock $\phi_2$ ($\phi_4$).

Figure 2:
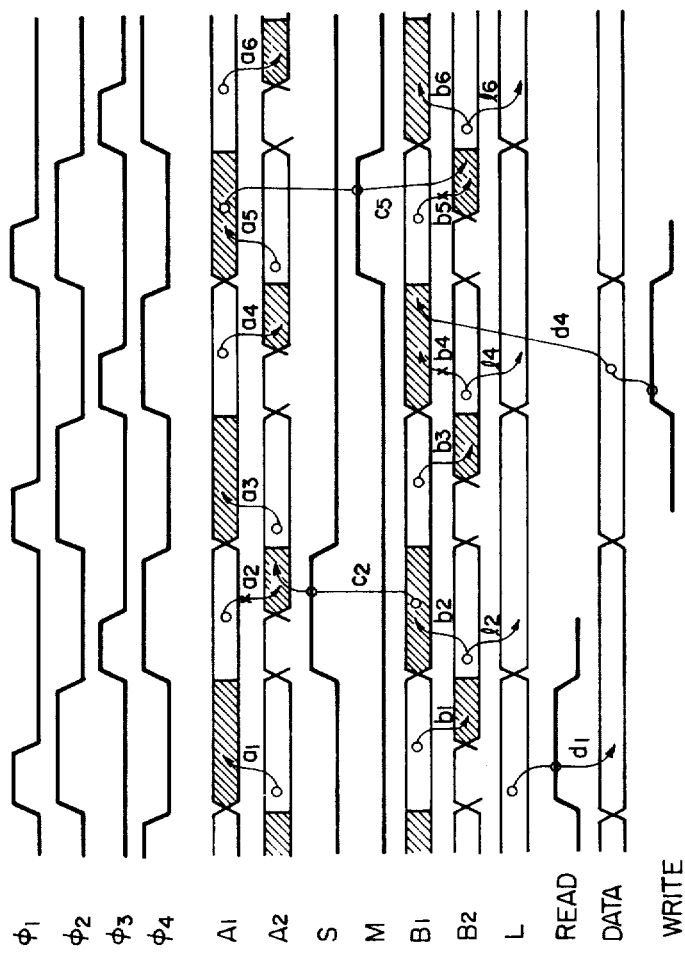
FIG. 2 is a signal time chart for explaining the circuit operation of the shift register.

In the shift register portion 1, accordingly, the signal $A_1$ delivered from the inverter 11 and passed through the switch 12 in synchronism with the clock $\phi_2$ appears as the signal $A_2$ on the output side of the dynamic inverter 13 in the latter half of the clock $\phi_4$, and the shift operation of the signal is carried out as illustrated by arrows $a_1-a_6$ in FIG. 2. Similarly, in the latch portion 2a, the output signal $B_1$ of the inverter 14 passed through the switch 15 in synchronism with the clock $\phi_4$ becomes the output $B_2$ of the dynamic inverter 16 in the latter half of the clock $\phi_2$ and is applied to the inverter 14 again, so that the signal shifts as illustrated by arrows $b_1-b_6$. At $A_1$, $A_2$, $B_1$ and $B_2$ in FIG. 2, hatched parts indicate periods in which the D.C. level of the signal is settled, and the other parts indicate periods in which an information is accumulated in the stray capacitance on the output side of the MOS element.

The control signal S for transmitting the signal stored in the latch portion 2a to the shift register portion 1 is given at a timing synchronous with the clock $\phi_4$. Thus, the data transferring switch 3 and the latch side switch 15 turn "on" simultaneously, and the latch output $B_1$ is applied to the dynamic inverter 13 of the shift register as shown by an arrow $C_2$ in FIG. 2. Since, in this case, the switch 12 on the shift register side is in the "off" state, it is unnecessary to cut the output of the inverter 11 anew.

Conversely, in case of transmitting the information of the shift register portion 1 to the latch portion 2a, the switch 3 is turned "on" by the control signal M synchronous with the clock $\phi_2$. During the period during which the control signal M is "1", the output signal of the inverter 11 on the shift register side passes through the switches 12 and 3 and is applied to the inverter 16 on the latch side in place of the signal $B_1$ as illustrated by an arrow $C_5$. Also in this case, the switch 15 on the latch side is in the "off" state, and it is unnecessary to cut the output of the inverter 14 anew.

In writing data from the external data line 102 into the latch portion 2a, the switch 20 of the data input/output portion 2b may be turned "on" by a write signal (WRITE) synchronous with the clock $\phi_4$. When the switch 20 turns "on" at this timing, the signal on the data line 102 is applied to the inverter 14 in place of the output $B_2$ of the inverter 16 as illustrated by an arrow $d_4$.

In reading the data stored in the latch portion 2a onto the external data line 102, the switch 19 is turned "on" by a read signal (READ) synchronous with the clock $\phi_2$, and the output L of the inverter 18 of the data input/output portion 2b is fetched onto the data line 102 as illustrated by an arrow $d_1$. In this case, the switch 17 is turned "on" every cycle in synchronism with the clock $\phi_4$, whereby the latch output is always fetched to the inverter 18 of the data input/output portion as illustrated by arrows $l_2$, $l_4$ and $l_6$.

While the circuit arrangement and operation of the 1-bit constituent have been described above, the shift register with the latch circuit according to this invention has a required number of such 1-bit stages connected in cascade so as to form a shift register for holding signals of the plurality of bits. As apparent from the description of the operation, in the shift register with the latch circuit according to this invention, the operating timings of the shift register and the latch circuit are caused to deviate a half cycle, and the timing of the data transfer between them is made coincident with the "off" period of the switching element on the receiving side, whereby the transfer of the data can be executed without disposing exclusive switching elements for the respective signal paths of the shift register and the latch circuit. Moreover, in the signal path in which the two stages of MOS switches succeed, that is, the path which includes the MOS switches 12 and 3 or those 15 and 3, both the MOS switches turn "on" at the synchronous timing, so that the signal level does not fluctuate due to charge sharing. In addition, a stable input signal is applied owing to the static inverter in the signal path, so that the circuit operation is reliable. Further, since the shift register of this invention utilizes the dynamic inverter, the power dissipation may be low, and since its circuit arrangement is simple, it is especially suited to the form of a LSI.

Figure 4:
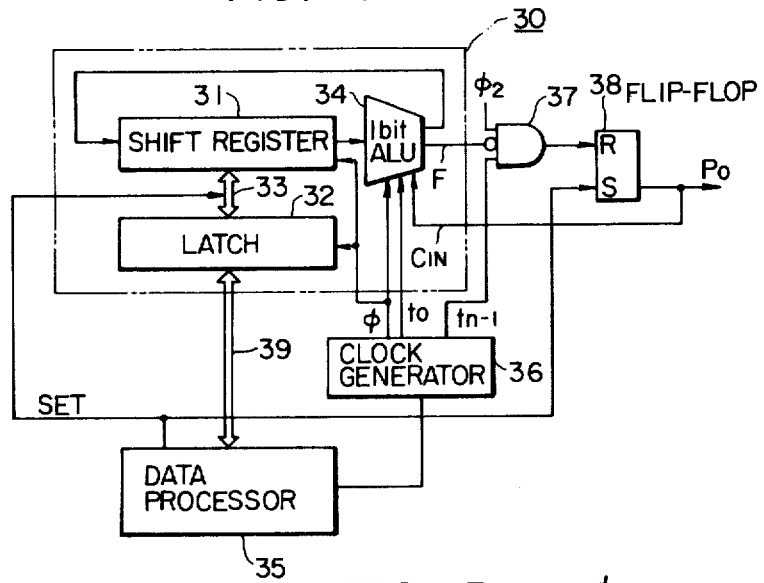
FIG. 4 is a diagram showing a control system including a serial arithmetic logic unit which is an example of application of the shift register of this invention.

Referring now to FIG. 4, there will be explained a control system including a serial arithmetic logic unit which is an example of application of the shift register with the latch circuit according to this invention.

In FIG. 4, the system includes a shift register 31 which is constructed by connecting the foregoing 1-bit shift registers in cascade to the amount of n bits, latch 32 which is composed of the foregoing latch portions 2a and data input/output portions 2b corresponding to the respective bits, signal lines 33 which include the data transfer switches 3 for the respective bits, and a 1-bit ALU 34 which is connected to the least significant bit of the shift register 31 and which executes an operation corresponding to one bit in one cycle and feeds the result back to the most significant bit of the shift register. These elements constitute the serial arithmetic logic unit 30.

Numeral 35 designates a data processor which gives the serial ALU 30 an operation command, numeral 36 a clock generator which generates various clocks necessary for the arithmetic operation of the serial ALU, numeral 37 an AND gate, and numeral 38 a flip-flop.

The circuit of FIG. 4 functions as the control system which applies certain desired value data from the data processor 35 to the serial ALU 30 and processes this data by means of the serial ALU, thereby to produce a pulse output $P_o$ of a pulse width corresponding to the desired value from the flip-flop 38.

More specifically, the data processor 35 sets the desired value data into the latch circuit 32 through a bus 39 and subsequently provides a set signal SET at an operation start timing. Thus, the switches of the signal lines 33 turn "on" to transfer the desired value data from the latch circuit 32 to the shift register 31 in parallel, and the flip-flop 38 is simultaneously set.

The 1-bit ALU 34 decrements the data at a timing $t_o$ at which the signal of the least significant bit of the given data is provided from the shift register 31. It provides a flag signal F = "1" while the value of the data in the shift register is not zero, and provides F = "0" when the value of the data has become zero. Accordingly, at a timing $t_{n-1}$ at which the most significant bit of the data is provided from the shift register 31, the ALU output F is received at the reset terminal of the flip-flop 38 through the AND gate 37. If F = "0", the flip-flop 38 is reset. Thus, the output pulse of the flip-flop 38 becomes one of the pulse width corresponding to the given desired value.

Figure 5:
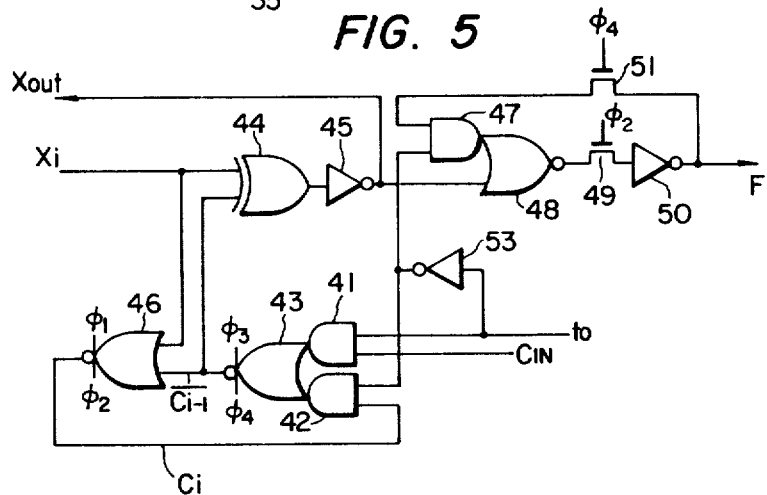
FIG. 5 is a concrete circuit diagram of a 1-bit arithmetic logic unit which is a part of the serial arithmetic logic unit.

An example of a concrete circuit of the 1-bit ALU 34 is shown in FIG. 5, and a signal time chart thereof in FIG. 6.

In the figures, $X_i$ indicates an input signal at the i-th bit from the shift register 31, $X_{out}$ an output signal to be fed back to the most significant bit of the shift register 31, and $C_i$ a carry signal at the i-th bit. Here, letting $C_{i-1}$ denote a carry signal at the (i−1)-th bit, $X_{out}$ and $C_i$ in the decrementing operation are given by the following logical expressions:

$$X_{out} = X_i \oplus C_{i-1} = \overline{X_i \oplus \overline{C_{i-1}}} \tag{1}$$

$$C_i = X_i \cdot C_{i-1} = \overline{X_i + \overline{C_{i-1}}} \tag{2}$$

In the circuit of FIG. 5, an operation command signal $C_{IN}$ as well as the operation start signal $t_o$ which becomes "1" for one shift cycle period in synchronism with the least significant bit input of the data from the shift register is externally applied to an AND gate 41, the output of which is given to a NOR circuit 43. If $C_{IN}$="1" in the period of $t_o$="1", the output $\overline{C_{i-1}}$ of the NOR circuit 43 and the input $X_i$ from the shift register 31 are applied to an exclusive OR (EOR) circuit 44, and the operated result $X_{out}$ at the first bit conforming with Expression (1) is obtained from an inverter 45. The signals $X_i$ and $\overline{C_{i-1}}$ are also applied to a NOR circuit 46, whereby the carry signal $C_i$ at the first bit conforming with Expression (2) is obtained. The output of the NOR circuit 46 is applied to an AND gate 42, which gives the signals $\overline{C_{i-1}}$ at $t_o$="0", in other words, at and after the second bit in succession. Accordingly, while the data of the shift register are shifted one circulation, the operations of $X_i$ and $C_i$ up to the most significant bit are successively executed by the use of the outputs $\overline{C_{i-1}}$ of the NOR gate 43 based on the outputs of the AND gate 42. Since the operation start signal $t_o$ becomes "1" every n-th shift cycle, the decrementing operation described above is repeated insofar as the signal $C_{IN}$ is "1".

A closed loop which consists of an AND gate 47, a NOR circuit 48, an inverter 50 and MOS switches 49 and 51 forms a latch for storing the flag signal F indicative of the operated result. The AND gate 47 is controlled by the signal $t_o$ received through an inverter 53, and blocks the feedback of the signal from the inverter 50 to the NOR gate 48 in the cycle of $t_o$="1". That is, the latch once renders the value of the signal F "0" at $t_o$="1" and thereafter stores the operated result of $F_i = F_{i-1} + X_{out}$. Accordingly, when the status of the signal F is decided at the time $t_{n-1}$ at which the signal $X_i$ (i=n−1) of the most significant bit of the data of the shift register 31 has been provided, whether or not the data of the shift register has become zero can be known. The circuit of FIG. 4 is so constructed that when the flag signal F has become "0", the flip-flop 38 is reset to render the pulse output $P_o$ and the signal $C_{IN}$ "0", thereby to inhibit the decrement processing from the next cycle.

Figure 7:
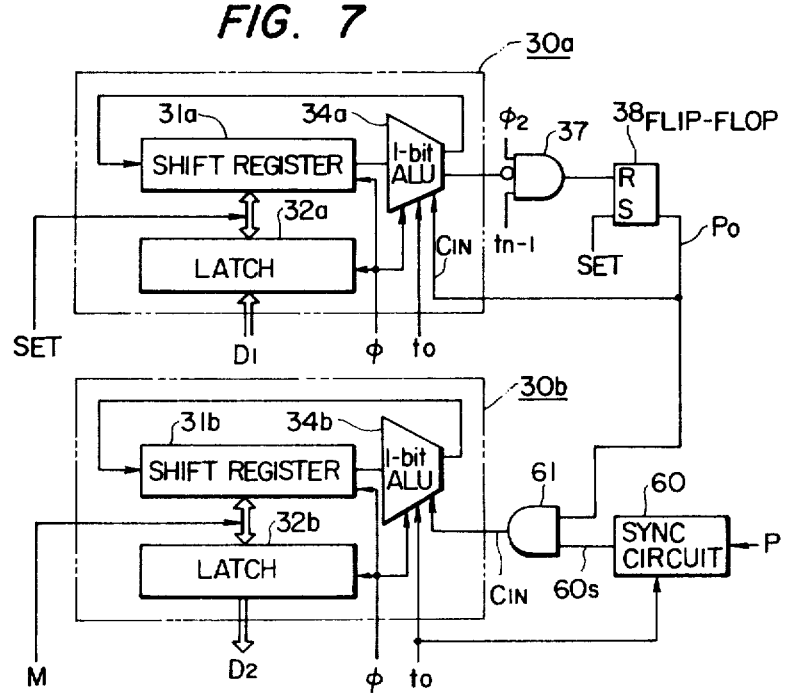
FIG. 7 is a diagram showing another example of a system including a serial arithmetic logic unit which applies the shift register with a latch circuit according to this invention.

FIG. 7 shows a system for counting the number of pulses P applied within a fixed time, as another example of application of the serial arithmetic logic unit. This circuit employs a first serial ALU 30a similar to the serial ALU in FIG. 4 as executes the decrementing operation and a second serial ALU 30b which executes an incrementing operation. Desired value data $D_1$ are externally given to the first serial ALU 30a, and a pulse $P_o$ with a pulse width corresponding to the desired value is delivered from a flip-flop 38. The pulse $P_o$ enables an AND gate 61 for a period corresponding to its pulse width, whereby an output signal 60s from a synchronous circuit 60 is applied to the second serial ALU 30b as a signal $C_{IN}$.

The synchronous circuit 60 serves to convert pulses to-be-measured P appearing irregularly, into pulses synchronous with the operation start timing $t_o$ of the second serial ALU 30b. The second serial ALU 30b increments the content of a register 31b only when the signal $C_{IN}$ is "1" at the timing $t_o$.

Accordingly, upon lapse of an appointed time width, a move signal M is applied to the second serial ALU 30b so as to transfer the data of the shift register 31b to a latch circuit 32b, and the content of the latch circuit 32b is thereafter read out externally as data $D_2$, whereby the number of the pulses P having appeared can be known.

In case of counting the widths of input pulses by the use of the serial ALU, the pulses to-be-measured may be applied as the signal $C_{IN}$ of the second ALU 30b in FIG. 7, the counting operation being made in the period in which the signal $C_{IN}$ is "1", the counted data being transferred from the shift register 31b to the latch 32b.

While the shift register with the latch circuit according to this invention as above described is especially effective for the serial ALU, the invention is also applicable to a use in which data of a shift register with a plurality of bits are partially fetched externally or conversely a part of data successively applied to the shift register is replaced with data given externally, and it is effective very greatly.

What is claimed is:

1. A shift register with a latch circuit comprising:
   a shift register which is constructed of a plurality of bit stages connected in cascade, each bit stage being formed of a series circuit consisting of a first static inverter, a first switching element and a first dynamic inverter;
   a plurality of latch circuit portions which constitute the latch circuit, which correspond to the bit stages of said shift register respectively, and each of which is formed of a closed loop consisting of a second static inverter, a second switching element and a second dynamic inverter;
   a plurality of third switching elements, each connected between a respective one of said bit stages of said shift register and a latch circuit portion corresponding thereto, so as to control data transfers between said shift register and said latch circuit; and
   clock means connected to said shift register and said latch circuit for generating clock pulses to drive said shift register and said latch circuit so that they may shift data with a phase deviation of a half cycle therebetween.

2. A shift register with a latch circuit as defined in claim 1, wherein said each third switching element is connected between a signal line coupling the first switching element and the first dynamic inverter and a signal line coupling the second switching element and the second dynamic inverter.

3. A shift register with a latch circuit as defined in claim 1 or 2, wherein said clock means includes means for generating a first train of pulses for driving the respective first switching elements and a second train of pulses for driving the respective second switching elements, with the phase deviation of a half cycle therebetween, said respective third switching elements being connected to be driven by a signal synchronous with said first train of pulses at the data transfers from said shift register to said latch circuit and by a signal synchronous with said second train of pulses at the data transfers from said latch circuit to said shift register.

4. A shift register with a latch circuit as defined in claim 1, 2 or 3, further comprising fifth means connected to each latch circuit portion for selectively reading-out data from said second static inverter onto an external data line or for writing data on said data line into said second static inverter in response to an applied command signal.

5. In a serial arithmetic logic unit having:
shift register means which is composed of a plurality of bit stages for successively shifting data from a most significant bit side thereof to a least significant bit side thereof,
1-bit arithmetic logic means connected to receive an output signal of the least significant bit stage of said shift register means and to feed a processed result back to the most significant bit stage of said shift register,
latch circuit means connected in parallel with the respective bit stages of said shift register means through a plurality of switches for temporarily storing data of a plurality of bits, and
pulse generating means for applying driving pulses to said shift register means, said 1-bit arithmetic logic means and said latch circuit means;
the improvement comprising:
each bit stage of said shift register means being formed of a series circuit which consists of a first static inverter, a first switching element and a first dynamic inverter,
said latch circuit includes a plurality of closed loops each corresponding to a respective one of the bit stages of said shift register means, each closed loop consisting of a second static inverter, a second switching element and a second dynamic inverter and being connected to the corresponding one of the bit stages of said shift register through a corresponding one of the first-mentioned switches, and
the respective first switching elements of said shift register means and the respective second switching elements of said latch circuit means being drive at operation timings with a phase deviation of a half cycle therebetween by the driving pulses applied thereto from said pulse generating means.

6. A shift register with a latch circuit comprising:
shift register means including a plurality of bit stages connected in cascade, each bit stage including a first portion connected to an output of a preceding bit stage and a second portion connected to an output of said first portion, wherein said first portion includes means responsive to a first clock for providing a first signal having an inverted level of a signal provided from said preceding stage when the first clock is applied thereto, and said second portion including means responsive to a second clock for providing a second signal having an inverted level of a signal provided to an input thereof when the second clock is applied thereto;
latch circuit means including a plurality of latch stages, each latch stage being connected to a corresponding one of said bit stages of said shift register means and including a third portion and a fourth portion having an input and an output respectively connected to an output and an input of said third portion, wherein said third portion includes means responsive to said first clock for providing a third signal having an inverted level of a signal provided to said input thereof when the first clock is applied thereto, and said fourth portion includes means responsive to said second clock for providing a fourth signal having an inverted level of a signal provided to said input thereof;
a plurality of switch means each interposed between said output of said third portion of one of said latch stages and said output of said first portion of a corresponding one of said bit stages; and
means for rendering said switch means conductive in response to said first and second clocks, respectively, when signals are transferred from said shift register means to said latch circuit means and vice versa.

7. A combination according to claim 6, wherein said first portion of each bit stage comprises a first static inverter connected to the output of said preceding bit stage, and a first switch connecting an output of said first static inverter to said second portion of said each bit stage in response to said first clock;
wherein said second portion of said each bit stage comprises a first dynamic inverter;
wherein said third portion of each latch stage comprises a second dynamic inverter;
wherein said fourth portion of said each latch stage comprises a second static inverter connected to receive an output of said second dynamic inverter and a second switch connecting an output of said second static inverter to said input of said third portion of said each latch stage in response to said second clock.

8. A combination according to claim 7, wherein each latch stage further comprises
a third static inverter; a third switch connecting said output of said second static inverter to an input of said third static inverter;
a fourth switch connecting an output of said third static inverter to a data bus in response to a read signal which is provided thereto in synchronism with said first clock when a signal is to be transferred from said latch circuit means to said data bus;
a fifth switch connecting said data bus to said input of said second static inverter in response to a write signal which is provided thereto in synchronism with said second clock when a signal is to be transferred from said data bus to said latch circuit means.

9. A combination according to claim 6, wherein said first and second clocks are separated in time from each other by half of the cycle of said first clock.

* * * * *